(12) United States Patent
Kwak et al.

(10) Patent No.: US 9,391,123 B2
(45) Date of Patent: Jul. 12, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Won-Kyu Kwak, Yongin (JP); Ji-Eun Lee, Yongin (JP)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 67 days.

(21) Appl. No.: 14/177,404

(22) Filed: Feb. 11, 2014

(65) Prior Publication Data

US 2014/0284569 A1  Sep. 25, 2014

(30) Foreign Application Priority Data

Mar. 19, 2013 (KR) .................. 10-2013-0029233

(51) Int. Cl.
*H01L 29/08* (2006.01)
*H01L 35/24* (2006.01)
*H01L 51/00* (2006.01)
*H01L 27/32* (2006.01)

(52) U.S. Cl.
CPC .................. *H01L 27/3216* (2013.01)

(58) Field of Classification Search
CPC ..................... H01L 27/32; H01L 27/3216
USPC ................... 438/34, 38, 99; 257/40
See application file for complete search history.

(56) References Cited

U.S. PATENT DOCUMENTS

2012/0012834 A1* 1/2012 Sonoda et al. .................. 257/40

FOREIGN PATENT DOCUMENTS

JP  2007-305465 A  11/2007
KR  10-2004-0024484 A  3/2004

* cited by examiner

*Primary Examiner* — Charles Garber
*Assistant Examiner* — Abdulfattah Mustapha
(74) *Attorney, Agent, or Firm* — Lee & Morse, P.C.

(57) ABSTRACT

An OLED display includes pixels, each including a first light emission region having a first area and a first perimeter and a second light emission region disposed neighboring the first light emission region and having a second area and a second perimeter. The first area, the first perimeter, the second area, and the second perimeter respectively satisfy an equation of $A1*P2=A2*P1$, where A1 is the first area, P1 is the first perimeter, A2 is the second area, and P2 is the second perimeter.

11 Claims, 6 Drawing Sheets

A1 = 1  A2 = 2     A1 = 1  A2 = 2
P1 = 4  P2 = 6     P1 = 4  P2 = 8

A1 x P2 ≠ A2 x P1   A1 x P2 = A2 x P1

(A)                 (B)

A1 = 1    A2 = 2        A1 = 1    A2 = 2
P1 = 4    P2 = 6        P1 = 4    P2 = 8

A1 x P2  ≠  A2 x P1      A1 x P2  =  A2 x P1

(A)                      (B)

ORGANIC LIGHT EMITTING DIODE DISPLAY

CROSS-REFERENCE TO RELATED APPLICATION

This application claims priority to and the benefit of Korean Patent Application No. 10-2013-0029233 filed in the Korean Intellectual Property Office on Mar. 19, 2013, the entire contents of which are incorporated herein by reference.

BACKGROUND

1. Field

Embodiments relate to an organic light emitting diode (OLED) display. More particularly, embodiments relate to an OLED display including light emission regions.

2. Description of the Related Art

As a display device which displays an image, an organic light emitting diode (OLED) display has come into the spotlight in recent years. The OLED display device is self-emissive, i.e., does not require a separate light source, which is different from a liquid crystal display (LCD) device. Thus, the OLED display device may have a decreased thickness and weight compared to the LCD device. Also, the OLED display device exhibits high quality characteristics, such as low power consumption, high luminance, and high reaction speed, and the like.

In general, an OLED display includes a plurality of pixels, each including an organic light emitting element that includes a first electrode, an organic emission layer disposed on the first electrode, and a second electrode disposed on the organic emission layer. Here, each pixel includes a light emission region formed by an opening that is formed by a pixel defined layer (PDL) that covers lateral ends of the first electrode.

In a conventional OLED display, each pixel includes a green light emission region emitting green light, a red light emission region emitting red light, and a blue light emission region emitting blue light.

The above information disclosed in this Background section is only for enhancement of understanding of the background of the invention and therefore it may contain information that does not form the prior art that is already known in this country to a person of ordinary skill in the art.

SUMMARY

One or more embodiments are directed to providing an OLED display including pixels, at least one pixel including a first light emission area having a first region and a first perimeter and a second light emission region disposed neighboring the first light emission region and having a second area and a second perimeter. The first area, the first perimeter, the second area, and the second perimeter respectively satisfy an equation of $A1*P2=A2*P1$, and, in the equation, A1 is the first area, P1 is the first perimeter, A2 is the second area, and P2 is the second perimeter.

The second area may be larger than the first area.

A first border of the first light emission region may be formed in the shape of a line and a second border of the second light emission region may be formed in the shape of protrusions and depressions.

The first light emission region may include a single first area and the second light emission region may include a plurality of divided second regions together providing the second area A2.

The second light emission region may include at least one of non-light emission regions provided in the second light emission region.

The non-light emission region may be arranged as an island in the second light emission region.

The first light emission region may emit green light and the second light emission may emit red light.

The pixel may further include a third light emission region disposed neighboring the first light emission region and having a third area and a third perimeter, the first area, the first perimeter, the third area, and the third perimeter respectively satisfy an equation of $A1*P3=A3*P1$. In the equation, A1 may be the first area, P1 may be the first perimeter, A3 may be the third area, and P3 may be the third perimeter.

The third area may be larger than the first area and the second area.

The first light emission region may emit green light and the third light emission region may emit blue light.

DETAILED DESCRIPTION

Figure 1:
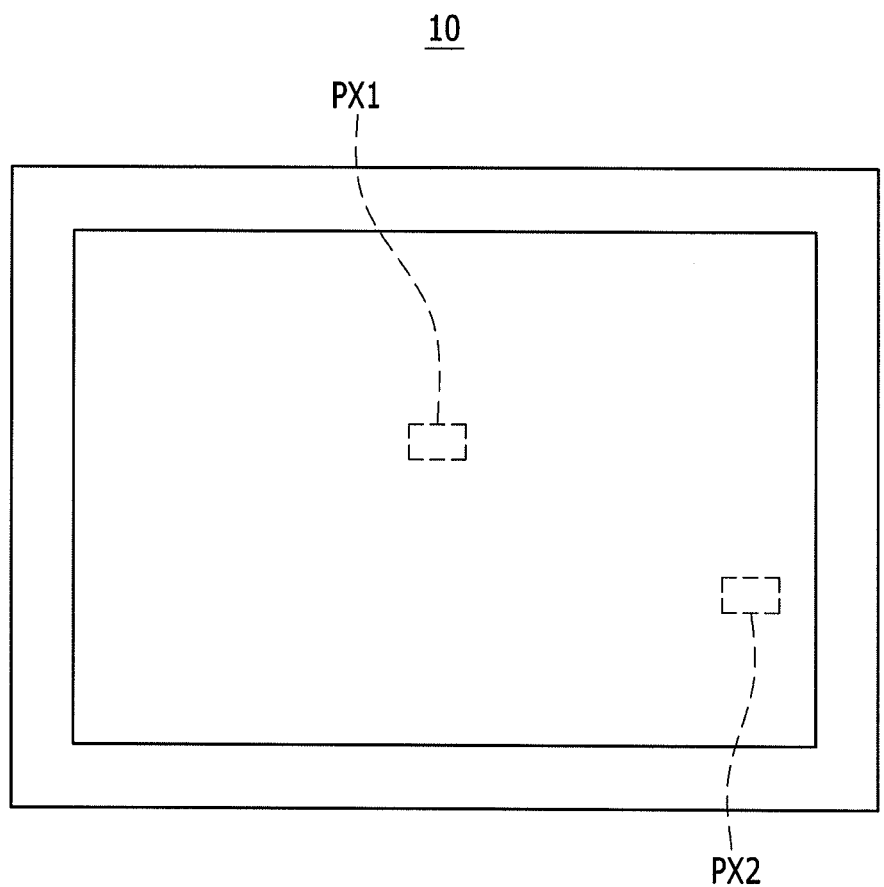
FIG. 1 is a top plan view of a conventional OLED display.

Exemplary embodiments will be described more fully hereinafter with reference to the accompanying drawings, in which exemplary embodiments of the invention are shown. As those skilled in the art would realize, the described embodiments may be modified in various different ways, all without departing from the spirit or scope herein.

The drawings and description are to be regarded as illustrative in nature and not restrictive. Like reference numerals designate like elements throughout the specification.

Further, in several exemplary embodiments, a constituent element having the same configuration will be representatively described in a first exemplary embodiment by using the same reference numeral, and other configurations different from those of the first exemplary embodiment will be described in other exemplary embodiments.

As the size and thickness of the respective structural components shown in the drawings are arbitrarily illustrated for explanatory convenience, and embodiments are not necessarily limited to the illustrated. In addition, unless explicitly described to the contrary, the word "comprise" and variations such as "comprises" or "comprising", will be understood to imply the inclusion of stated elements but not the exclusion of any other elements.

First, the discovered problem to be solved by embodiments is explained with reference to conventional organic light emitting diode (OLED) displays. Hereinafter, a pixel implies the minimum unit displaying an image.

FIG. 1 is a top plan view of a conventional OLED display. In further detail, as shown in FIG. 1, the embodiments disclosed below arose from the discovery that area ratios of a green light emission region, a red light emission region, and a blue light emission region of a second pixel PX2 disposed in an outer edge portion of a conventional OLED display 10 were different from each other compared to an area ratio of light emission areas of a first pixel PX1 disposed in a center portion of the OLED display 10.

Figure 2:
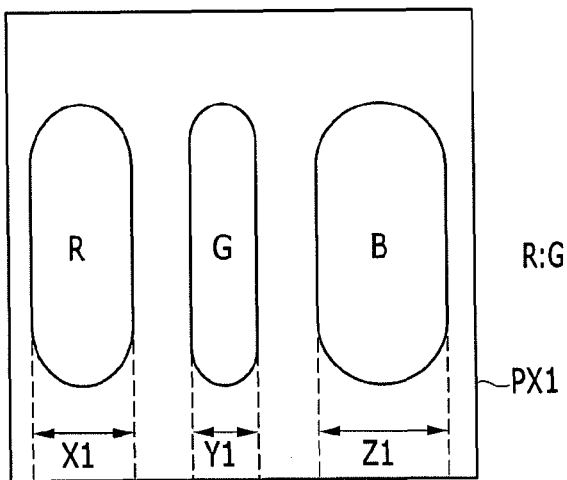
FIG. 2 illustrates a first pixel and a second pixel of FIG. 1.
Figure 2:
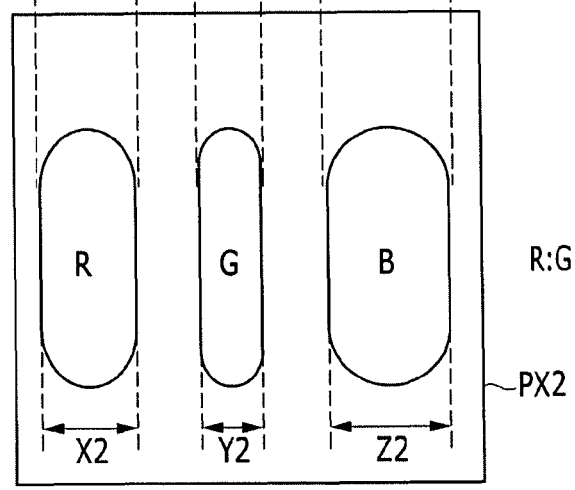

FIG. 2 shows the first pixel and the second pixel shown in FIG. 1. In FIG. 2, (A) shows the first pixel and (B) shows the second pixel. Each of the first pixel PX1 and the second pixel PX2 of the conventional OLED 10 includes a first electrode, an organic emission layer disposed on the first electrode, and a second electrode disposed on the organic emission layer, and also includes a green light emission region G, a red light emission region R, and a blue light emission region B formed by openings. The openings can be formed by a pixel defined layer (PDL) covering lateral ends of the first electrode.

In addition, each of the green light emission region G, the red light emission region R, and the blue light emission region B of the conventional OLED display 10 includes a first emission layer emitting a green light, a second emission layer emitting a red light, and a third emission layer emitting a blue light. The first, second, and third emission regions respectively have different life-spans so that they respectively have predetermined area ratios.

For example, it was discovered that the red light emission region R, the green light emission region G, and the blue light emission region B of the first pixel PX1 of the conventional OLED display 10 had an area ratio of 1.13:1:1.25, but, due to a deviation in a process for forming the pixel defined layer, the red light emission region R, the green light emission region G, and the blue light emission region B of the pixel PX2 of the OLED display 10 had an area ratio of 1.01:1:1.28.

In further detail, it was discovered that, due to the process deviation, critical dimensions (CD) X2, Y2, and Z2 of the red light emission region R, the green light emission region G, and the blue light emission region B of the second pixel PX2 were decreased compared to critical dimensions X1, Y1, and Z1 of the red light emission region R, the green light emission region G, and the blue light emission region B of the first pixel PX1 so that the area ratio (i.e., 1.01:1:1.28) of the red light emission region R, the green light emission region G, and the blue light emission region B of the second pixel PX2 was different from the area ratio (i.e., 1.13:1:1.25) of the red light emission region R, the green light emission region G, and the blue light emission region B of the first pixel PX1, which is an area ratio set depending on the life-span of the emission layer.

Thus, in the conventional OLED display, critical dimensions (CD) of a green light emission region, a red light emission region, and a blue light emission region of a pixel disposed in an outer edge of the OLED display tend to be lower than critical dimensions of a green light emission region, a red light emission region, and a blue light emission region of a pixel disposed in a center portion of the OLED display due to a deviation in a process for forming a pixel defined layer and thus an area ratio of a green light emission region, a red light emission region, and a blue light emission region of one pixel is different from an area ratio of a green light emission region, a red light emission region, and a blue light emission region of another pixel. The following embodiments are directed to addressing this discovered problem.

Figure 3:
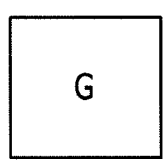
FIG. 3 is a figure provided for pinpointing a problem.
Figure 3:
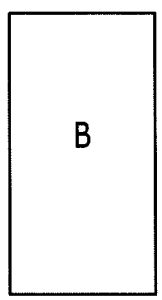
Figure 3:
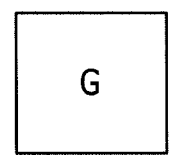
Figure 3:
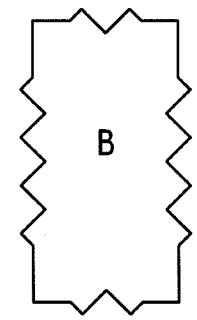

FIG. 3 is a figure provided for further understanding of the problem and solutions thereto once the problem has been discovered.

As shown in (A) of FIG. 3, when areas of the green light emission region G and the blue light emission region B forming the first pixel PX1 that is disposed in a center portion of the OLED display 10 are A1 and A2, perimeters of the two regions G and B are P1 and P2, critical dimensions of the respective regions G and B are changed due to a process deviation, and the critical dimension change is denoted as x, the areas of the green light emission region G and the blue light emission region B of the second pixel PX2 disposed in the outer edge portion of the OLED display 10 are respectively given as the following A1' and A2'.

$$A1'=A1+P1*x$$

$$A2'=A2+P2*x$$

Without considering the critical dimension change of each of the green light emission region G and the blue light emission region B of the second pixel PX2 compared to the first pixel PX1, the area ratio of the green light emission region G and the blue light emission region B of the first pixel PX1 can be equivalent to the area ratio of the green light emission region G and the blue light emission region B of the second pixel PX2 if the Equation 1 is satisfied.

$$A1/A2=A1/A2' \qquad \text{Equation 1}$$

Equation 1 can be changed to Equation 2 by applying A1+P1*x and A2+P2*x to A1' and A2', respectively.

$$A1*P2=A2*P1 \qquad \text{Equation 2}$$

That is, it was determined that when the green light emission regions G and the blue light emission regions B of the first and second pixels PX1 and PX2 satisfied Equation 2, the green light emission regions G and the blue light emission regions B of the first pixel PX1 and the second pixel PX2 respectively have the same area ratio, and following embodiments are directed to utilizing this determination.

For example, as shown in (A) of FIG. 3, when, in one of the first pixel PX1 and the second pixel PX2, A1 and P1 of a green light emission region G of are respectively 2 and 4 and A2 and P2 of a blue light emission region B are respectively 2, and 6, A1*P2≠A2*P1. Accordingly, an area ratio of the green light emission region G and the blue light emission region B of the first pixel P1 and the green light emission region G and the blue light emission region B of the pixel PX2 become different from each other. That is, the problem of the difference between the area ratios of the green light emission regions G and the blue light emission regions B of the first pixel PX1 and the second pixel PX2 cannot be solved.

In contrast, as shown in (B) of FIG. 3, when in one of the first pixel P1 and the second pixel P2, A1 and P1 of a green light emission region G are respectively 1 and 4 and A2 and P2 of a blue light emission region B are respectively 2 and 8, A1*P2=A2*P1. Therefore, an area ratio of the green light emission region G and the blue light emission region B of the first pixel P1 and an area ratio of the green light emission region G and the blue light emission region B of the second pixel P2 become equivalent to each other. That is, the problem of the difference between the area ratios of the green light emission regions G and the blue light emission regions B of the first pixel PX1 and the second pixel PX2 can be solved.

Figure 4:
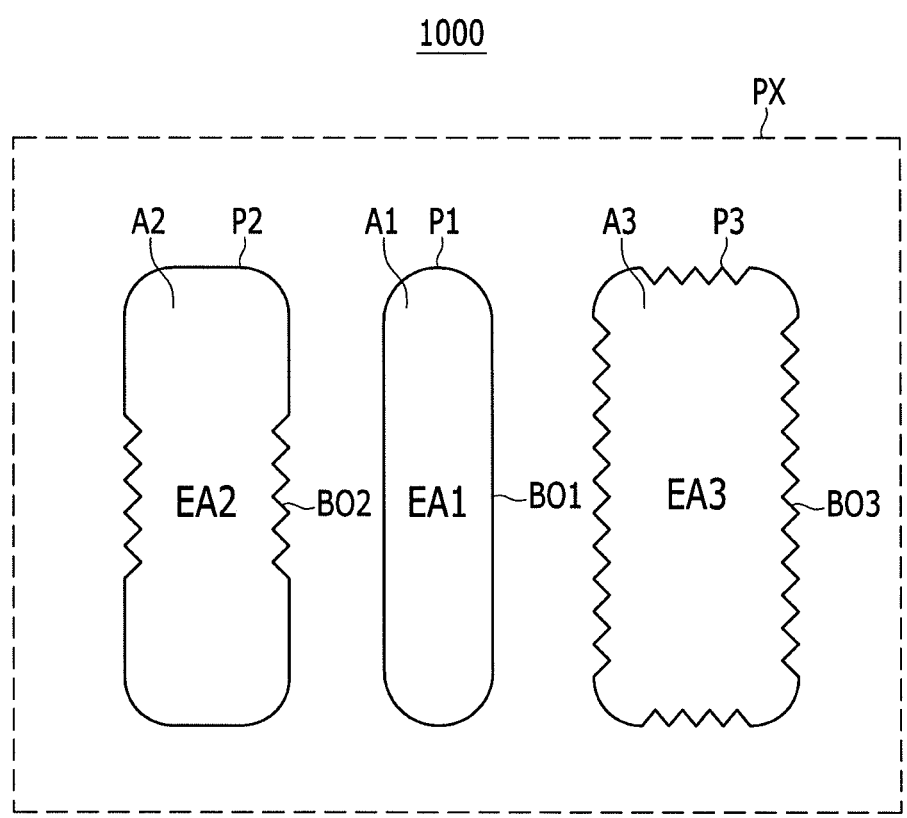
FIG. 4 illustrates a pixel of an OLED display according to a first exemplary embodiment.

Hereinafter, an OLED display according to a first exemplary embodiment will be described with reference to FIG. 4. FIG. 4 illustrates a pixel of the OLED display according to the first exemplary embodiment.

An OLED display 1000 according to the first exemplary embodiment includes a plurality of pixels PX that are the minimum units for displaying an image, a single pixel PX being illustrated in FIG. 4. As would be apparent to one of skill in the art, each of the plurality of pixels PX will include a first electrode, an organic emission layer disposed on the first electrode, and a second electrode disposed on the organic emission layer. As illustrated in FIG. 4, at least one pixel PX, e.g., pixels in a periphery of the OLED display 1000 or all pixels in the OLED display 1000, includes a first light emission region EA1, a second light emission region EA2, and a third light emission region EA3 that can be formed by an opening formed in a pixel defined layer PDL that covers lateral ends of the first electrode.

While the first light emission region EA1, the second light emission region EA2, and the third light emission region EA3 of the pixel PX according to the first exemplary embodiment may be respectively formed by the opening of the pixel defined layer, the respective regions EA1, EA2, and EA3 may be formed by any structure that opens or otherwise defines a light emission area.

The first light emission region EA1 may include an emission layer emitting green light, the second light emission region EA2 may include an emission layer emitting red light, and the third light emission region EA3 may include an emission layer emitting blue light. That is, the first light emission region EA1 emits green light, the second light emission region EA2 emits red light, and the third light emission region EA3 emits blue light. Alternatively, a first light emission area, a second light emission area, and a third light emission area may respectively emit one of white light, cyan light, and yellow light, or any other such configuration suitable for realizing a full color image.

The first light emission region EA1 has a first area A1 and a first perimeter P1, and the second light emission region EA2 has a second area A2 and a second perimeter P2. The first area A1, the first perimeter P1, the second area A2, and the second perimeter P2 respectively satisfy $A1*P2=A2*P1$. Here, A1 is the first area A1, P1 is the first perimeter P1, A2 is the second area A2, and P2 is the second perimeter P2.

Since a red light emission layer included in the second light emission region EA2 has shorter life span compared to a green light emission light included in the first light emission a region EA1, the second area A2 is larger than the first area A1. Since the first area A1, the first perimeter P1, the second area A2, the second perimeter P2 satisfy an equation of $A1*P2=A2*P1$, a first border BO1 of the first light emission region EA1 is formed in the shape of a line and a second border BO2 of the second light emission region EA2 is formed in the shape of protrusions and depressions.

In addition, the third light emission region EA3 has a third area A3 and a third perimeter P3. The first area A1, the first perimeter P1, the third area A3, and the third perimeter P3 satisfy an equation of $A1*P3=A3*P1$. Here, A1 is the first area A1, P1 is the first perimeter P1, A3 is the third area A3, and P3 is the third perimeter P3.

Since a blue light emission layer included in the third light emission region EA3 has shorter life span compared to the green light emission layer included in the first light emission region EA1, the third area A3 is larger than the first area A1. Further, a blue light emission layer included in the third light emission region EA3 has shorter life span compared to the red light emission layer included in the second light emission region EA2, the third area A3 is larger than the second area A2. For the first area A1, the first perimeter P1, the third area A3, and the third perimeter P3 to satisfy an equation of $A1*P3=A3*P1$, the first border BO1 is linearly shaped and a third border BO3 of the third light emission region EA3 is formed in the shape of protrusions and depressions, and the third border BO3 of the third light emission region EA3 is extended further longer than the second border BO2 of the second light emission region EA2.

As described, in the OLED display 1000 according to the first exemplary embodiment, the first light emission region EA1 has the first border BO1 and the second light emission region EA2 has the second border BO2 so that the first area A1 and the first perimeter P1 of the first light emission area EA1 and the second area A2 and the second perimeter P2 of the second light emission region EA2 satisfy the equation of $A1*P2=A2*P1$. Accordingly, although the critical dimension (CD) of each of the first light emission region EA1 and the second light emission region EA2 of pixels PX that are different from one another and respectively disposed in different locations on the OLED display 1000 is changed due to a process deviation, an area ratio of a first light emission region EA1 and a second light emission region EA2 of any pixel disposed in any location on the entire OLED display 1000 is not changed.

Further, since the first light emission region EA1 has the first border BO1 and the third light emission region EA3 has the third border BO3, the first area A1 and the first perimeter P1 of the first light emission region EA1 and the third area A3 and the third perimeter P3 of the third light emission region EA3 satisfy the equation of $A1*P3=A3*P1$. Accordingly, although the critical dimensions of the first light emission regions EA1 and the third light emission regions EA3 of pixels that are different from one another and disposed in different locations on the OLED display 1000 are changed due to the process deviation, an area ratio of a first light emission region EA1 and a third light emission region EA3 of any pixel disposed in any location on the entire OLED display 1000 is not changed.

That is, although the process deviation occurs, an area ratio of a first light emission region EA1, a second light emission region EA2, and the third light emission region EA3 of any pixel PX disposed in any location throughout the OLED display 1000 is not changed according to the first exemplary embodiment.

Accordingly, the first light emission region EA1, the second light emission region EA2 and the third light emission region EA3 of each of the plurality of pixels PX have the same life span, thereby improving entire life span of the OLED display 1000.

Hereinafter, an OLED display according to a second exemplary embodiment will be described with reference to FIG. 5. Hereinafter, only features distinguished from the first exemplary embodiment will be described, and the omitted explanation is the same parts as in the first exemplary embodiment. Only characteristic components distinguished from the first exemplary embodiment will be extracted and described, and the components omitted from the description of the second exemplary embodiment follow the first exemplary embodiment.

Figure 5:
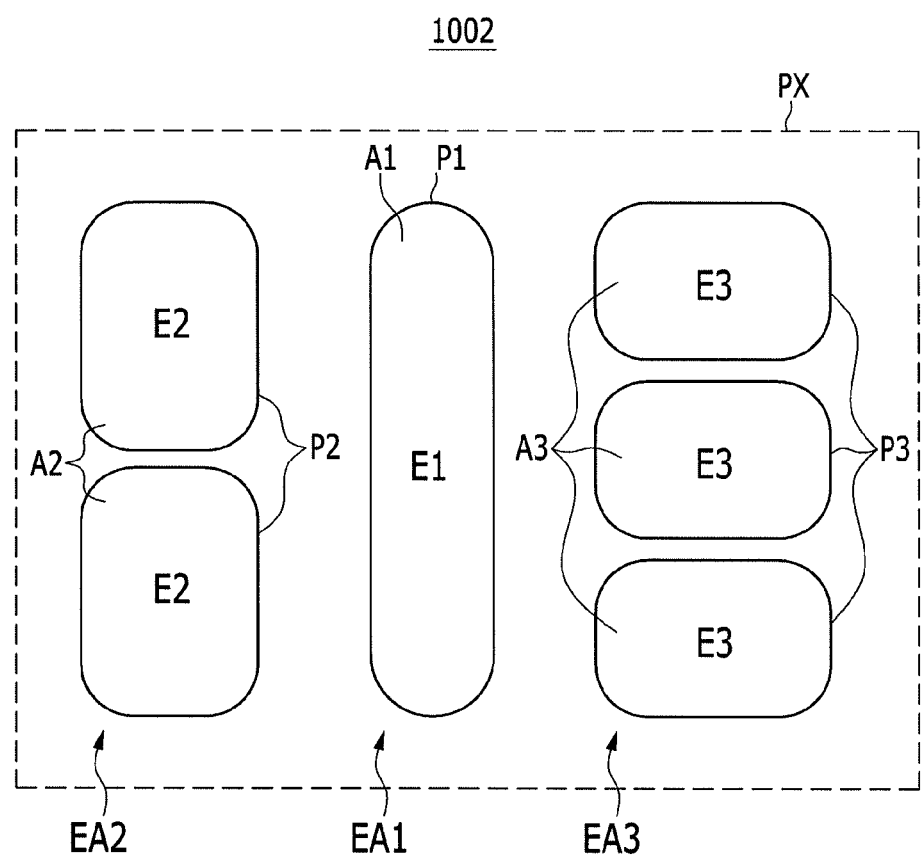
FIG. 5 illustrates a pixel of an OLED display according to a second exemplary embodiment.

FIG. 5 is a cross-sectional view of a pixel of an OLED display according to the second exemplary embodiment. As shown in FIG. 5, in at least one pixel PX of an OLED display 1002 according to the second exemplary embodiment, a first light emission region EA1 has one first region E1, a second light emission region EA2 has two second regions EA2, and a third light emission regions EA3 has three third regions E3 such that equations $A1*P2=A2*P1$ and $A1*P3=A3*P1$ can be satisfied. That is, the second light emission region EA2 and the third light emission region EA3 respectively include a plurality of divided regions, and the third light emission regions EA3 includes more divided areas than the second light emission region EA2.

As described, in the OLED display 1002 according to the second exemplary embodiment, the first light emission region EA1 includes one first region E1 and the second light emission region EA2 includes the plurality of second regions E2 so that a first area A1 and a first perimeter P1 of the first light emission region EA1 and second areas A2 and second perimeters P2 of the second light emission regions EA2 satisfy the equation of $A1*P2=A2*P1$. Accordingly, although the critical dimension of each of the first light emission region EA1 and the second light emission regions EA2 of pixels PX that are different from one another and respectively disposed in different locations on the OLED display 1002 is changed due to a process deviation, an area ratio of a first light emission region EA1 and a second light emission region EA2 of any pixel disposed in any location on the entire OLED display 1002 is not changed.

In addition, in the OLED display 1002 according to the second exemplary embodiment, the first light emission region EA1 has the first region E1 and the third light emission region EA3 has the plurality of regions E3 so that the first area A1 and the first perimeter P1 of the first light emission region EA1 and third areas A3 and the third perimeters P3 of the third light emission region EA3 satisfy the equation of A1*P3=A3*P1. Accordingly, although the critical dimensions of the first light emission areas EA1 and the third light emission regions EA3 of pixels that are different from one another and disposed in different locations on the OLED display 1002 are changed due to the process deviation, an area ratio of a first light emission region EA1 and a third light emission region EA3 of any pixel disposed in any location on the entire OLED display 1002 is not changed.

That is, although the process deviation occurs, an area ratio of a first light emission region EA1, a second light emission region EA2, and the third light emission region EA3 of any pixel PX disposed in any location throughout the OLED display 1002 is not changed according to the second exemplary embodiment.

Accordingly, the first light emission area EA1, the second light emission region EA2 and the third light emission region EA3 of each of the plurality of pixels PX have the same life span, thereby improving entire life span of the OLED display 1002.

Hereinafter, an OLED display according to a third exemplary embodiment will be described with reference to FIG. 6. Hereinafter, only features distinguished from the first exemplary embodiment will be described, and the omitted explanation is the same parts as in the first exemplary embodiment. Only characteristic components distinguished from the first exemplary embodiment will be extracted and described, and the components omitted from the description of the third exemplary embodiment follow the first exemplary embodiment.

Figure 6:
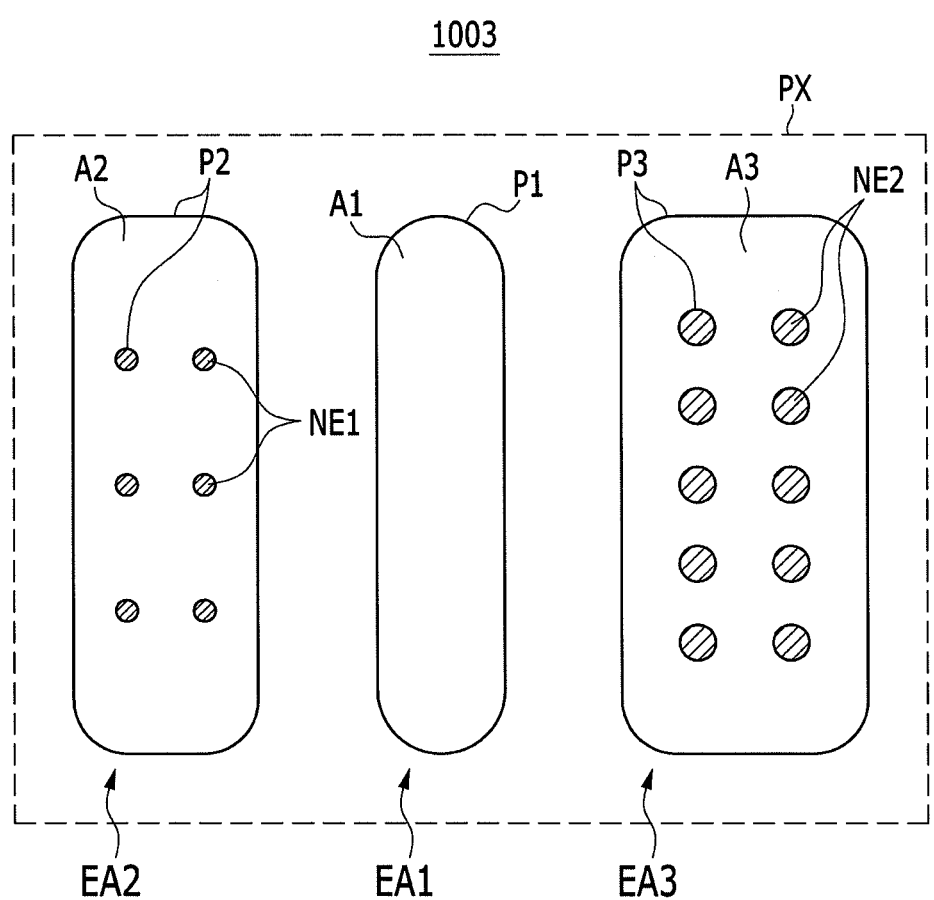
FIG. 6 illustrates a pixel of an OLED display according to a third exemplary embodiment.

FIG. 6 shows a pixel of an OLED display according to the third exemplary embodiment. As shown in FIG. 6, at least one pixel PX in an OLED display 1003 according to the third exemplary embodiment includes a second light emission region EA2 having six of first non-light emission regions NE1 arranged as islands in the second light emission region EA2 and a third light emission region EA3 includes 10 of second non-light emission regions NE2 arranged as islands in the third light emission region EA such that the equations A1*P2=A2*P1 and A1*P3=A3*P1 can be satisfied.

That is, the second light emission region EA2 and the third light emission region EA3 respectively include a plurality of first non-light emission regions NE1 and a plurality of second non-light emission regions NE2. The first non-light emission regions NE1 and the second non-light emission regions NE2 are different from each other in size and number, and the number of the second non-light emission regions NE2 may be greater than the number of first non-light emission regions NE2 and the size of the second non-light emission region NE2 may be larger than the size of the first non-light emission region NE1.

As described, in the OLED display 1003 according to the third exemplary embodiment, the second light emission region EA2 includes the plurality of first non-light emission regions NE1 so that a first area A1 and a first perimeter P1 of the first light emission region EA1 and a second area A2 and a second perimeter P2 of the second light emission region EA2 satisfy the equation of A1*P2=A2*P1. Accordingly, although the critical dimensions of the first light emission regions EA1 and the second light emission regions EA2 of pixels that are different from one another and disposed in different locations on the OLED display 1002 are changed due to the process deviation, an area ratio of a first light emission region EA1 and a second light emission region EA2 of any pixel disposed in any location on the entire OLED display 1003 is not changed.

In addition, in the OLED display 1003, the third light emission region EA3 includes the plurality of second non-light emission regions NE2 so that the first area A1 and the first perimeter P1 of the first light emission region EA1 and a third area A3 and a third perimeter P3 of the third light emission region EA3 can satisfy the equation of A1*P3=A3*P1. Accordingly, although the critical dimensions of the first light emission regions EA1 and the third light emission regions EA3 of pixels that are different from one another and disposed in different locations on the OLED display 1002 are changed due to the process deviation, an area ratio of a first light emission region EA1 and a third light emission region EA3 of any pixel disposed in any location on the entire OLED display 1003 is not changed.

That is, although the process deviation occurs, an area ratio of a first light emission region EA1, a second light emission region EA2, and the third light emission region EA3 of any pixel PX disposed in any location throughout the OLED display 1003 is not changed according to the third exemplary embodiment.

Accordingly, the first light emission region EA1, the second light emission region EA2 and the third light emission region EA3 of each of the plurality of pixels PX have the same life span, thereby improving entire life span of the OLED display 1003.

According to one of exemplary embodiments, although critical dimensions (CD) of a plurality of light emission regions of a pixel disposed in an outer edge of the OLED display are lower than critical dimensions of a plurality of light emission regions of another pixel disposed in a center portion of the OLED display, an area ratio of a plurality of light emission regions of one pixel can be equivalent to an area ratio of a plurality of light emission regions of another pixel.

By way of summation and review, embodiments provide an organic light emitting diode (OLED) display of which each pixel has an equivalent area ratio of a plurality of light emission regions even though critical dimensions (CD) of a plurality of light emission regions of a pixel disposed in an outer edge of the OLED display are lower than critical dimensions of a plurality of light emission regions of another pixel disposed in a center portion of the OLED display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. An organic light emitting diode (OLED) display comprising a plurality of pixels, at least one pixel including:
    a first light emission region having a first area A1 and a first perimeter P1; and a second light emission region disposed neighboring the first light emission region and having a second area A2 and a second perimeter P2, the second area A2 of the second light emission region being different from the first area A1 of the first light emission region, wherein
the first area A1, the first perimeter P1, the second area A2, and the second perimeter P2 satisfy an equation A1*P2=A2*P1 such that an area ratio of the first area A1 to the second area A2 is constant.

2. The OLED display of claim 1, wherein the second area A2 is larger than the first area A1, and
the second perimeter P2 is longer than the first perimeter P1.

3. The OLED display of claim 2, wherein a first border of the first light emission region is linear and a second border of the second light emission region includes protrusions and depressions.

4. The OLED display of claim 2, wherein the first light emission region includes a single first area A1 and the second light emission region includes a plurality of divided second regions together providing the second area A2.

5. The OLED display of claim 2, wherein the second light emission region comprises at least one non-light emission regions provided in the second light emission area.

6. The OLED display of claim 5, wherein the non-light emission region is arranged as an island in the second light emission region.

7. The OLED display of claim 2, wherein the first light emission region emits green light and the second light emission region emits red light.

8. The OLED display of claim 1, wherein the at least one pixel further comprises:
a third light emission region disposed neighboring the first light emission region, the third light emission region having a third area A3 and a third perimeter P3,
wherein the first area A1, the first perimeter P1, the third area A3, and the third perimeter P3 satisfy an equation A1*P3=A3*P1.

9. The OLED display of claim 8, wherein the third area A3 is larger than the first area A1.

10. The OLED display of claim 8, wherein the first light emission region emits green light and the third light emission region emits blue light.

11. The OLED display of claim 1, wherein
the second perimeter P2 of the second light emission region includes a non-linear portion.

* * * * *